US011774867B2

(12) United States Patent
Godfried et al.

(10) Patent No.: US 11,774,867 B2
(45) Date of Patent: Oct. 3, 2023

(54) RADIATION MEASUREMENT SYSTEM

(71) Applicant: ASML Netherlands B.V., Veldhoven (NL)

(72) Inventors: Herman Philip Godfried, Amsterdam (NL); Wilhelmus Patrick Elisabeth Maria Op 'T Root, Nederweert (NL)

(73) Assignee: ASML Netherlands B.V., Veldhoven (NL)

( * ) Notice: Subject to any disclaimer, the term of this patent is extended or adjusted under 35 U.S.C. 154(b) by 41 days.

(21) Appl. No.: 17/433,494

(22) PCT Filed: Jan. 27, 2020

(86) PCT No.: PCT/EP2020/051861
§ 371 (c)(1),
(2) Date: Aug. 24, 2021

(87) PCT Pub. No.: WO2020/173635
PCT Pub. Date: Sep. 3, 2020

(65) Prior Publication Data
US 2022/0146944 A1 May 12, 2022

(30) Foreign Application Priority Data

Feb. 25, 2019 (EP) ..................... 19159180

(51) Int. Cl.
*G03F 7/20* (2006.01)
*G01J 3/45* (2006.01)
*G03F 7/00* (2006.01)

(52) U.S. Cl.
CPC .............. *G03F 7/7085* (2013.01); *G01J 3/45* (2013.01); *G03F 7/70558* (2013.01); *G03F 7/70575* (2013.01)

(58) Field of Classification Search
CPC .............. G01J 3/45; G01J 3/4531; G01J 3/26
See application file for complete search history.

(56) References Cited

U.S. PATENT DOCUMENTS 5,801,831 A 9/1998 Sargoytchev
6,952,253 B2 10/2005 Lof et al.
(Continued)

FOREIGN PATENT DOCUMENTS

JP H08-306619 A 11/1996
JP H11-307444 A 11/1999
(Continued)

OTHER PUBLICATIONS

International Search Report and Written Opinion of the International Searching Authority directed to related International Patent Application No. PCT/EP2020/051861, dated Apr. 22, 2020; 10 pages.
(Continued)

*Primary Examiner* — Uzma Alam
*Assistant Examiner* — Hoai Thi Thu Nguyen
(74) *Attorney, Agent, or Firm* — Sterne, Kessler, Goldstein & Fox P.L.L.C.

(57) ABSTRACT

A radiation measurement system (200) comprising an optical apparatus (205) configured to receive a radiation beam (210) and change an intensity distribution of the radiation beam to output a conditioned radiation beam (215), and a spectrometer (220) operable to receive the conditioned radiation beam and determine spectral content of the conditioned radiation beam. The radiation measurement system may form part of a lithographic apparatus.

18 Claims, 7 Drawing Sheets

(56) References Cited

U.S. PATENT DOCUMENTS

| | | |
|---|---|---|
| 7,282,701 B2 | 10/2007 | Kok et al. |
| 7,655,367 B2 | 2/2010 | Buurman et al. |
| 8,896,816 B2 | 11/2014 | Patra |
| 9,791,780 B2 | 10/2017 | Onose et al. |
| 9,983,060 B1* | 5/2018 | Zhao ............... G03F 7/70516 |
| 10,288,483 B2* | 5/2019 | King ............... G01J 3/0205 |
| 2003/0161374 A1 | 8/2003 | Lokai |
| 2004/0043303 A1 | 3/2004 | Lassiter et al. |
| 2004/0263844 A1 | 12/2004 | Rafac |
| 2006/0082751 A1 | 4/2006 | Moors et al. |
| 2006/0169928 A1 | 8/2006 | Sogard et al. |
| 2006/0215134 A1 | 9/2006 | Buurman et al. |
| 2008/0037025 A1 | 2/2008 | Rafac |
| 2010/0007491 A1 | 1/2010 | Kleihorst et al. |
| 2010/0178596 A1 | 7/2010 | Constancias |
| 2011/0304837 A1 | 12/2011 | Patra |
| 2015/0355025 A1* | 12/2015 | Duffey ............. G03F 7/70041 355/67 |
| 2016/0109298 A1* | 4/2016 | Durfee ............. G02B 27/149 356/451 |
| 2016/0341602 A1 | 11/2016 | Thornes |
| 2018/0149522 A1 | 5/2018 | Zhao |
| 2018/0149523 A1 | 5/2018 | Zhao et al. |
| 2018/0254600 A1 | 9/2018 | Kumazaki et al. |
| 2018/0292263 A1 | 10/2018 | King |

FOREIGN PATENT DOCUMENTS

| | | |
|---|---|---|
| JP | 2002-122483 A | 4/2002 |
| JP | 2003-243752 A | 8/2003 |
| JP | 2004-271498 A | 9/2004 |
| JP | 2005-003389 A | 1/2005 |
| JP | 2006-184077 A | 7/2006 |
| JP | 2008-535209 A | 8/2008 |
| JP | 2009-544965 A | 12/2009 |
| JP | 2011-171521 A | 9/2011 |
| JP | 2012-013715 A | 1/2012 |
| JP | 2012-518286 A | 8/2012 |
| WO | WO 2006/100076 A1 | 9/2006 |
| WO | WO 2015/008731 A1 | 1/2015 |
| WO | WO 2018/191056 A1 | 10/2018 |

OTHER PUBLICATIONS

International Preliminary Report on Patentability directed to related International Patent Application No. PCT/EP2020/051861, dated Aug. 25, 2021; 7 pages.

Chen et al., "Fabry-Perot-type antireflective coating for deep-ultraviolet binary photomask applications," Optical Society of America, Applied Optics, vol. 41, No. 19, Jul. 1, 2002; pp. 3961-3965.

* cited by examiner

RADIATION MEASUREMENT SYSTEM

CROSS-REFERENCE TO RELATED APPLICATIONS

This application claims priority of EP application 19159180.9 which was filed on Feb. 25, 2019 and which is incorporated herein in its entirety by reference.

The present invention relates to a radiation measurement system. The radiation measurement system may be used to determine a spectral content of a conditioned radiation beam in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable the creation of smaller features. To project a pattern on a substrate a lithographic apparatus may use electromagnetic radiation. The wavelength of this radiation at least partially determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

It is desirable to provide accurate control over the dose of radiation that is delivered to a substrate (e.g., a resist covered wafer) within a lithographic apparatus. It is desirable to provide a radiation measurement system that obviates or mitigates one or more problems of the prior art whether identified herein or elsewhere.

SUMMARY

According to a first aspect of the invention, there is provided a radiation measurement system comprising an optical apparatus configured to receive a radiation beam and change an intensity distribution of the radiation beam to output a conditioned radiation beam, and a spectrometer operable to receive the conditioned radiation beam and determine spectral content of the conditioned radiation beam.

The radiation measurement system according to the first aspect of the invention is advantageous, as now discussed. The optical apparatus may be used to condition a radiation beam (for example to control the angular and/or spatial intensity distribution of the radiation) for some purpose. For example, the optical apparatus may be an illumination system for a lithographic apparatus that may be configured to condition a radiation beam before it is incident on a mask or reticle. The inventors of the present invention have realized that such conditioning of the radiation beam may affect the spectrum of the radiation beam. That is, the spectral content of the conditioned radiation beam may be different to the spectral content of the radiation beam received by the optical apparatus. Advantageously, the spectrometer is operable to receive the conditioned radiation beam and determine spectral content of the conditioned radiation beam and can therefore determine the spectrum (for example a center wavelength and/or a bandwidth) of the conditioned radiation before it is used for the purpose. For example, for embodiments wherein the conditioned radiation is used to form an image of a reticle or mask on a substrate (for example a silicon wafer), the spectral content may be used to control a dose of radiation received by parts of the substrate.

The spectrometer may comprise an interferometer configured to cause the conditioned radiation beam to interfere with itself and produce an interference pattern, one or more characteristics of the interference pattern being indicative of the spectral content.

The interferometer may comprise a projection system and an interferometric element positioned in or proximate to an object plane of the projection system.

The projection system may be configured to form an image of an object disposed at the object plane of the projection system.

The interferometric element may comprise an etalon.

Compared to most other interferometric elements, the etalon advantageously requires significantly less space for the interference pattern to develop and the resulting angular distribution of the radiation to be visible.

The interferometric element may comprise a plurality of etalons arranged at different positions in or proximate to the object plane of the projection system.

The spectrometer may be operable to determine spectral content of the conditioned radiation beam at a plurality of positions at the object plane of the projection system.

The spectrometer may comprise a radiation sensor configured to detect a spatial intensity distribution of the interference pattern.

The radiation sensor may be an image sensor such as a CCD or CMOS camera.

The radiation sensor may be disposed in a Fourier transform plane of the object plane. This Fourier transform plane may be referred to as a pupil plane.

The radiation measurement system may further comprise an actuation system configured to generate relative movement between the object plane and the radiation sensor.

The spectrometer may comprise a plurality of radiation sensors arranged at different positions relative to the object plane such that each radiation sensor is configured to detect a spatial intensity distribution of the interference pattern arising from a different position on the object plane.

The radiation measurement system may further comprise a processor configured to receive a signal indicative of the spatial intensity distribution of the interference pattern from the radiation sensor and use the signal and a spectral property of the interferometer to determine spectral content of the conditioned radiation beam.

For example, a position (e.g., a radial position) in the plane of the radiation sensor may correspond to an angle in the plane of the interferometric element. A distribution of radial positions (e.g., as represented by a circular fringe in an interference pattern) can be converted into an angular distribution in the plane of the interferometric element. In turn, the angular distribution in the plane of the interferometric element can be converted into a spectral distribution using an interference condition (2nd cos $\theta_i = m\lambda$) using spectral properties of the interferometer (i.e., the refractive index n of the transmissive material and the distance d between the reflective surfaces of the etalon). For example, the processor may determine spectral content for a single point in the object plane.

The processor may be configured to determine a spectral intensity distribution of the conditioned radiation beam.

The processor may be configured to determine a bandwidth of the conditioned radiation beam.

For example, the bandwidth may be an E95 bandwidth. The E95 bandwidth may correspond to the spectrum width in which 95% of the entire spectral energy present in the conditioned radiation beam.

The processor may be configured to determine a center wavelength of the conditioned radiation beam.

The processor may be further configured to determine a spatial distribution of the bandwidth of the conditioned radiation beam.

For example, the spatial distribution may be across the object plane (e.g. the bandwidth at different x and y coordinates of the object plane).

The processor may be further configured to determine a spatial distribution of the center wavelength of the conditioned radiation beam.

For example, the spatial distribution may be across the object plane (e.g. the bandwidth at different x and y coordinates of the object plane).

The processor may be further configured to determine a contribution of the bandwidth of the conditioned radiation beam to a speckle of the conditioned radiation beam.

The radiation measurement system may further comprise a processor configured to use the spectral content at a plurality of positions at the object plane of the projection system to determine a spatial chirp of the conditioned radiation beam.

According to a second aspect of the invention, there is provided a lithographic apparatus comprising an illumination system configured to receive a radiation beam and change an intensity distribution of the radiation beam to output a conditioned radiation beam, a support structure for supporting a reticle in or proximate to an object plane of the lithographic apparatus such that the reticle is arranged to receive the conditioned radiation beam and impart the conditioned radiation beam with a pattern in its cross-section, a substrate table for supporting a substrate, a projection system configured to project the pattern onto the substrate, and a spectrometer operable to receive the conditioned radiation beam and determine spectral content of the conditioned radiation beam.

The illumination system may be considered to be an optical apparatus according to the first aspect of the invention. The spectrometer may be considered to be a spectrometer according to the first aspect of the invention. The advantages discussed in relation to the first aspect of the invention may also be realized here. For example, a contrast of an aerial image may be improved resulting in improved imaging performance. The contrast of the aerial image may be substantially matched to a reference value, e.g., determined using a reference optical system.

The spectrometer may comprise an interferometer configured to cause the conditioned radiation beam to interfere with itself and produce an interference pattern, one or more characteristics of the interference pattern being indicative of the spectral content.

The interferometer may comprise an interferometric element positioned in or proximate to an object plane of the projection system.

The interferometric element may comprise an etalon.

The interferometric element may comprise a plurality of etalons arranged at different positions in or proximate to the object plane of the projection system.

The spectrometer may be operable to determine spectral content of the conditioned radiation beam at a plurality of positions at the object plane of the projection system.

The spectrometer may comprise a radiation sensor configured to detect a spatial intensity distribution of the interference pattern.

The lithographic apparatus may further comprise an actuation system configured to generate relative movement between the object plane and the radiation sensor.

The spectrometer may comprise a plurality of radiation sensors arranged at different positions relative to the object plane such that each radiation sensor is configured to detect a spatial intensity distribution of the interference pattern arising from a different position on the object plane.

The lithographic apparatus may further comprise a processor configured to receive a signal indicative of the spatial intensity distribution of the interference pattern from the radiation sensor and use the signal and a spectral property of the interferometer to determine spectral content of the conditioned radiation beam.

The processor may be configured to determine a spectral intensity distribution of the conditioned radiation beam.

The processor may be configured to determine a bandwidth of the conditioned radiation beam.

The processor may be configured to determine a center wavelength of the conditioned radiation beam.

The processor may be further configured to determine a spatial distribution of the bandwidth of the conditioned radiation beam.

The processor may be further configured to determine a spatial distribution of the center wavelength of the conditioned radiation beam.

The processor may be further configured to use the bandwidth of the conditioned radiation beam to determine a contribution of the spectral content (e.g., the bandwidth) of the conditioned radiation beam to a speckle of the conditioned radiation beam.

The lithographic apparatus may further comprise a processor configured to use the spectral content at a plurality of positions at the object plane of the projection system to determine a spatial chirp of the conditioned radiation beam.

The interferometric element may form part of the reticle.

The reticle may further comprise extension optics configured to increase an angular extent of the interference pattern.

The interferometric element may form part of the support structure. This advantageously avoids the need to have a separate reticle available. This also advantageously increases a throughput of the lithographic apparatus due to increased availability due to the lack of need to replace the reticle.

The support structure may further comprise extension optics configured to increase an angular extent of an interference pattern.

The radiation sensor may be located on the substrate table.

The lithographic apparatus may further comprise a controller configured to control a component of the lithographic apparatus in dependence on the spectral content.

For example, the controller may control a laser source and/or one or more optical elements (e.g., lenses) of the projection system.

According to a third aspect of the invention, there is provided a reticle for use in a lithographic apparatus, the reticle comprising an etalon.

This advantageously provides an interferometer for spectral measurement of a conditioned beam at a size small enough to be easily incorporated or retrofitted into a majority of lithographic apparatus without further changes being necessary.

The reticle may further comprise extension optics configured to increase an angular extent of an interference pattern generated by the etalon.

The reticle may comprise a plurality of etalons.

The reticle may further comprise extension optics configured to increase an angular extent of an interference pattern generated by each etalon.

According to a fourth aspect of the invention, there is provided a support structure constructed to support a reticle in or proximate to an object plane of a lithographic apparatus, the support structure comprising an etalon.

This advantageously provides an interferometer for spectral measurement of a conditioned beam at a size small enough to be easily incorporated or retrofitted into a majority of lithographic apparatus without further changes being necessary.

The support structure may further comprise extension optics configured to increase an angular extent of an interference pattern generated by the etalon.

The support structure may comprise a plurality of etalons.

The support structure may further comprise extension optics configured to increase an angular extent of an interference pattern generated by each etalon.

According to a fifth aspect of the invention, there is provided a method of determining spectral content of a radiation beam after an optical apparatus has changed an intensity distribution of the radiation beam comprising using an interferometer to cause the radiation beam to interfere with itself and produce an interference pattern, one or more characteristics of the interference pattern being indicative of the spectral content, detecting a spatial intensity distribution of the interference pattern, using the spatial intensity distribution of the interference pattern and a spectral property of the interferometer to determine spectral content of the radiation beam.

The method may further comprise positioning an interferometric element of the interferometer in or proximate to an object plane of the optical apparatus.

The interferometric element may comprise an etalon. Using the interferometer may comprise causing the radiation beam to interact with the etalon.

The interferometric element may comprise a plurality of etalons. The method may further comprise arranging the etalons at different positions in or proximate to the object plane of the optical apparatus.

The method may further comprise determining the spectral content at a plurality of positions in the object plane of the optical apparatus.

The method may further comprise detecting a spatial intensity distribution of the interference pattern arising from different positions in or proximate to the object plane.

The method may further comprise using the spectral intensity distribution of the conditioned radiation beam to determine a bandwidth of the conditioned radiation beam.

The method may further comprise using the spectral intensity distribution of the conditioned radiation beam to determine a center wavelength of the conditioned radiation beam.

The method may further comprise determining a spatial distribution of the bandwidth of the conditioned radiation beam.

The method may further comprise determining a spatial distribution of the center wavelength of the conditioned radiation beam.

The method may further comprise using the bandwidth of the conditioned radiation beam to determine a contribution of the spectral content (e.g., bandwidth) of the conditioned radiation beam to a speckle of the conditioned radiation beam.

The method may further comprise using the spectral content at a plurality of positions in the object plane of the optical apparatus to determine a spatial chirp of the conditioned radiation beam.

According to a sixth aspect of the invention, there is provided a method of performing a lithographic exposure using a lithographic apparatus comprising receiving a radiation beam, changing an intensity distribution of the radiation beam to form a conditioned radiation beam, using a reticle held by a support structure in or proximate to an object plane of a projection system of the lithographic apparatus to impart the conditioned radiation beam with a pattern in its cross-section, projecting the pattern onto a substrate, and controlling a component of the lithographic apparatus in dependence on a spectral content of the conditioned radiation beam as determined using the method of the fifth aspect of the invention.

The method may further comprise performing another lithographic exposure using a different lithographic apparatus, wherein the spectral content is used to reduce a difference in performance between the two lithographic apparatus.

According to the invention a method is provided wherein a first lithographic apparatus is matched to a second lithographic apparatus after measuring a first proximity bias curve of the first lithographic apparatus, measuring first spectral content (or characteristics) of a conditioned radiation beam of the first lithographic apparatus to determine a first bandwidth, measuring a second proximity bias curve of the second lithographic apparatus, measuring second spectral content of a conditioned radiation beam of the second lithographic apparatus to determine a second bandwidth, and after adjusting at least one of the first bandwidth and the second bandwidth. Herewith, first and second lithographic apparatus are matched by the first and the second proximity bias curves, using the determined bandwidth.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g., with a wavelength of 365, 248, 193, 157, or 126 nm) and EUV (extreme ultra-violet radiation, e.g., having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
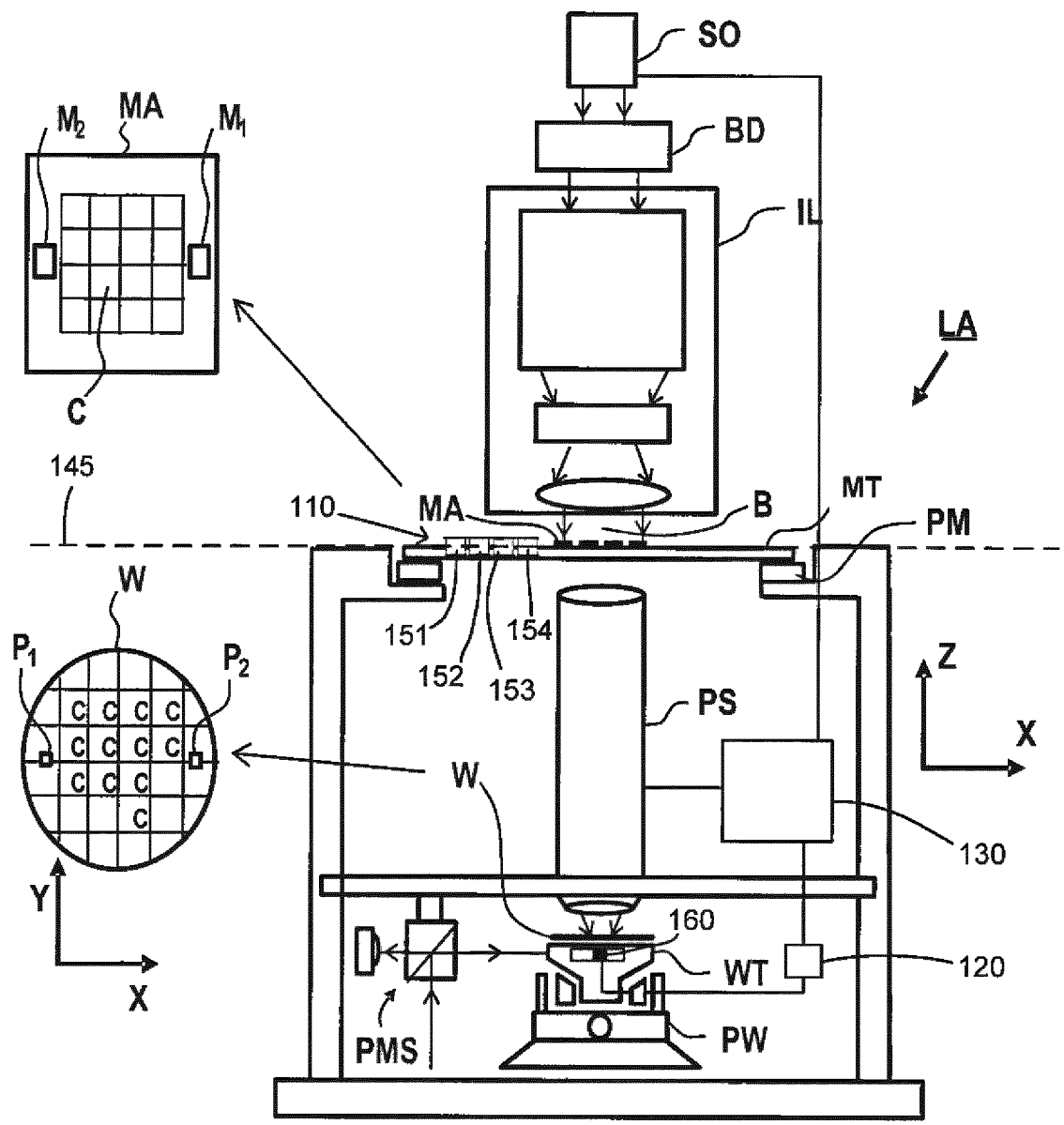
FIG. 1 schematically depicts an overview of a lithographic apparatus comprising a spectrometer according to an embodiment of the invention.

FIG. 1 schematically depicts a lithographic apparatus LA comprising a spectrometer according to an embodiment of the invention. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask or reticle) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g., via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA. The illuminator IL may be referred to as an optical apparatus that is configured to receive a radiation beam and change an intensity distribution of the radiation beam to output a conditioned radiation beam B.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such a "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS and/or a property of the radiation beam B. The measurement stage may hold multiple sensors. The cleaning device may be arranged to clean part of the lithographic apparatus, for example a part of the projection system PS or a part of a system that provides the immersion liquid. The substrate support WT may be arranged to hold one or more radiation sensors. The radiation sensors on the substrate support WT may be arranged to measure a property of the projection system PS and/or a property of the radiation beam B.

The spectrometer is operable to receive the conditioned radiation beam B and determine a spectral content of the conditioned radiation beam B. The spectrometer is discussed in greater detail below.

In operation, the radiation beam B is incident on the patterning device, e.g., mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an X-axis, a Y-axis and a Z-axis. Each of the three axes is orthogonal to the other two axes. A rotation around the X-axis is referred to as an Rx-rotation. A rotation around the Y-axis is referred to as an Ry-rotation. A rotation around about the Z-axis is referred to as an Rz-rotation. The X-axis and the Y-axis define a horizontal plane, whereas the Z-axis is in a vertical direction. The Cartesian coordinate system is not limiting the invention and is used for clarification only. Instead, another coordinate system, such as a cylindrical coordinate system or a spherical coordinate system, may be used to clarify the invention. The orientation of the Cartesian coordinate system may be different, for example, such that the Z-axis has a component along the horizontal plane.

In known lithographic apparatus and methods, lithographic errors occur which effect important parameters (e.g., critical dimension uniformity) of the lithographic process. The source of these lithographic errors is not always well understood. One suspected cause of at least some lithographic errors is unwanted variations of the spectral content of the conditioned radiation beam B. For example, a spectral bandwidth of the radiation beam is an important quantity as it influences the imaging on the substrate W. A contrast of an aerial image that is to be projected onto the substrate W at least partially depends on the spectral bandwidth of the radiation beam. This in turn influences the critical dimension uniformity of features that are to be formed on the substrate W. It will be appreciated that the spectral bandwidth is a quantity that is indicative of a width of a wavelength distribution. It will be further appreciated that a number of different definitions of a width parameter may be defined for such a wavelength distribution (which may be generally Gaussian-like). One example of such a width parameter for the spectral bandwidth of a radiation beam used in lithography is the "E95 bandwidth" of the radiation. This is the spectral bandwidth (expressed in, for example, pm) of the radiation beam that contains 95% of the total pulse energy of the radiation beam.

Known lithographic apparatus and methods either utilize a radiation measurement and feedback system within the radiation source SO itself or rely upon spectral information provided by a supplier of the radiation source SO at the time of purchasing the radiation source SO to monitor the spectral content of the radiation beam. However, lithographic errors still occur at the substrate W despite these known apparatus and methods indicating that the spectral content of the radiation beam B is acceptable. The inventors of the present invention have realized that conditioning of the radiation beam B may affect the spectral content of the radiation beam B. That is, the spectrum of the conditioned radiation beam B may be different to the spectrum of the radiation beam B before it is conditioned by the illumination system IS. For example, the transmission characteristics of the illumination system IL may at least partially depend upon a position within the radiation beam.

Known lithographic apparatus have no way of independently verifying the spectral information provided by the radiation measurement and feedback system within the radiation source SO and/or the spectral information provided by the supplier of the radiation source SO. Furthermore, some radiation sources SO are not capable of measuring the E95 of the radiation beam. For example, some known radiation sources SO are only capable of measuring the width parameter such as, for example, the full width at half maximum (FWHM) bandwidth of the radiation beam, which requires less accuracy to determine compared to the E95 bandwidth of the radiation beam. The inventors of the present invention have realized that the FWHM bandwidth of the radiation beam may not be an adequately accurate indicator of the bandwidth so as to ensure accurate imaging performance of the lithographic apparatus LA.

Another problem identified by the inventors of the present invention is that the radiation beam output by the radiation source SO may include a spatial chirp. That is, a center wavelength of emission from the radiation source SO may depend on the spatial position within the radiation beam. The spatial chirp may be at least partially caused by optical elements (e.g., a grating) used to narrow the spectrum emitted by the radiation source SO. In known lithographic apparatus and methods it is generally assumed that the illumination system IL mixes radiation from different parts of the radiation beam B such that any spatial differences in the wavelength of the radiation beam are substantially averaged out. However, the inventors of the present invention have realized that the spatial chirp of the radiation beam B may not be adequately accounted for by the illumination system, resulting in a non-negligible effect that may influence the imaging performance of the lithographic apparatus.

Both conditioning of the radiation beam B and the spatial chirp of the radiation beam B may contribute to the spectral content of the radiation beam B exiting the radiation SO differing from the spectral content of the conditioned radiation beam B exiting the illumination system IS. An embodiment of the present invention provides a radiation measurement system that may be installed in a lithographic apparatus LA and used to monitor the spectral content of the conditioned radiation beam. The spectral content of the conditioned radiation beam may be used to model and/or control a process that utilizes the conditioned radiation beam, e.g., a lithographic exposure. The radiation measurement system may be used for calibration purposes (e.g., for matching imaging performance between two different lithographic apparatus).

Additionally, the inventors have noticed that the bandwidth of the exposure radiation, which may be quantified by the E95 bandwidth, influences the contrast of the pattern features on a substrate (wafer). Which consequently has a significant influence on the critical dimension (CD) of these features. Variation in the E95 bandwidth during exposure may lead to variation in CD on wafer, known as on-wafer CD-uniformity. For example, a pattern provided on a substrate by two different lithographic apparatus, which have exposed the substrate each by means of a laser with different E95 bandwidth, may differ in CD due to the difference in contrast.

Figure 2:
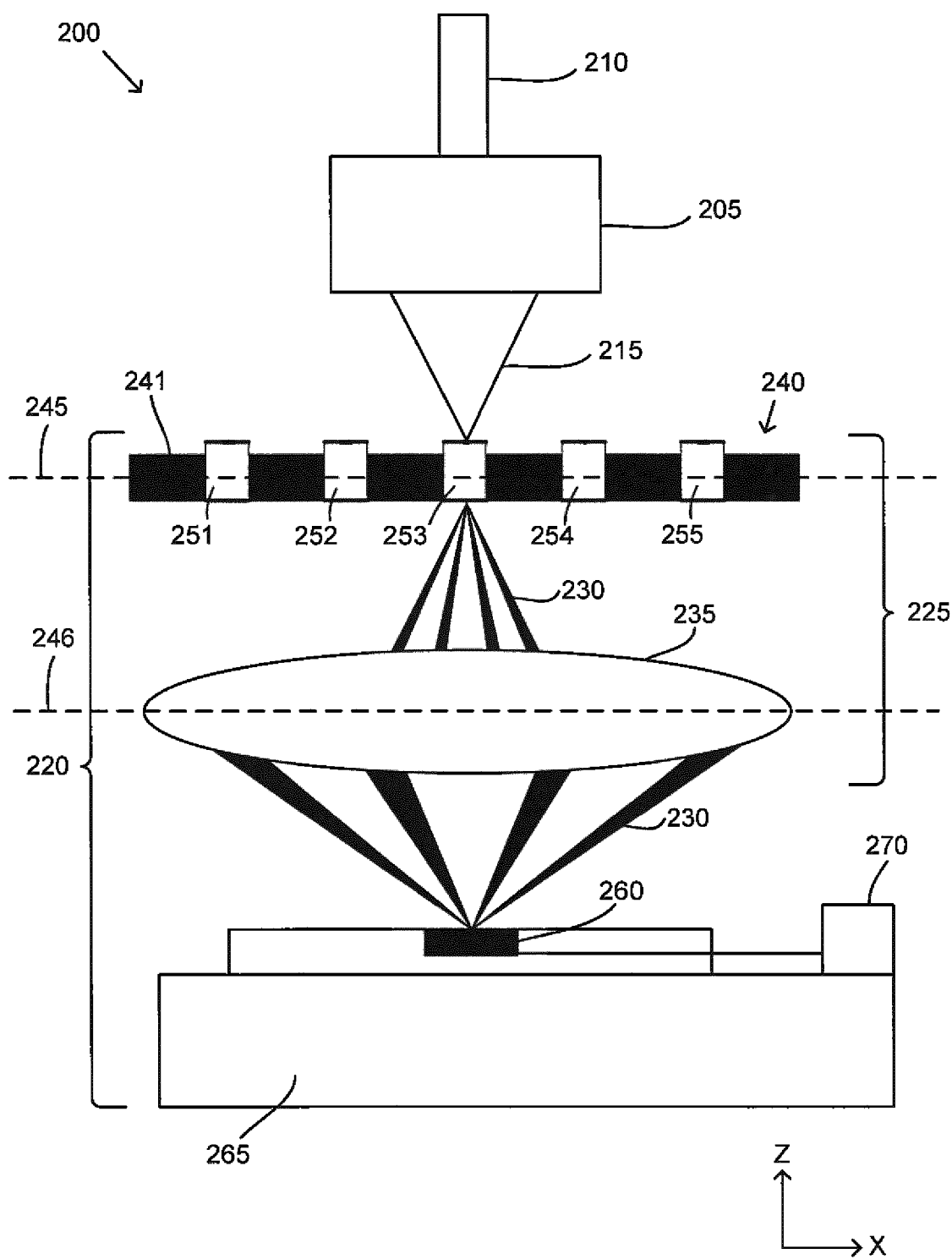
FIG. 2 schematically depicts a radiation measurement system comprising a plurality of etalons according to an embodiment of the invention.

FIG. 2 schematically depicts a radiation measurement system 200. The radiation measurement system 200 comprises an optical apparatus 205 configured to receive a radiation beam 210 and change an intensity distribution of the radiation beam 210 to output a conditioned radiation beam 215. The optical apparatus 205 may, for example, comprise an array of mirrors configured to reflect different parts of the radiation beam 210 in different directions and thereby control a cross-sectional shape of the radiation beam 210. The radiation measurement system 200 further comprises a spectrometer 220 operable to receive the conditioned radiation beam 215 and determine a spectral content of the conditioned radiation beam 215. In the example of FIG. 2, the spectrometer 220 comprises an interferometer 225 configured to cause the conditioned radiation beam 215 to interfere with itself and produce an interference pattern 230. One or more characteristics of the interference pattern 230 are indicative of the spectral content of the conditioned radiation beam 215. Other types of spectrometer 220 may be used such as, for example, a grating spectrometer, a prism spectrometer, etc.

The spectrometer 220 further comprises a radiation sensor 260 configured to detect a spatial intensity distribution of the interference pattern 230. The radiation sensor 260 may comprise a plurality of pixels (not shown). The pixels may, for example, be arranged in an array. The radiation sensor 260 may be an aerial image sensor such as, for example, a CCD or CMOS camera.

The interferometer 225 comprises a projection system 235 (e.g., one or more lenses) and an interferometric element 240 positioned in or proximate to an object plane 245 of the projection system 235. The interferometric element 240 is supported by a support 241. In the example of FIG. 2, the interferometric element 240 comprises a plurality of etalons 251-255 arranged at different positions in or proximate to the object plane 245 of the projection system 235. Alternatively, a single etalon that spans a desired area of the object plane 245 may be used (see FIG. 3). In the example of FIG. 2, the interferometric element 240 comprises five etalons 251-255. The interferometric element 240 may comprise a greater or smaller number of etalons 251-255. For example, the interferometric element 240 may comprise between one etalon and fifteen etalons, e.g., seven etalons. The etalons 251-255 may, for example, be Fabry-Perot etalons.

An etalon may comprise a body of transmissive material (e.g., glass, fused-silica, quartz, etc.) having two opposing reflective surfaces. The reflective surfaces may be polished parallel to one another to a very high accuracy (e.g., such that surface variations are of the order of about $\lambda/50$ or less where $\lambda$ is the wavelength of radiation that is to interact with the etalon). The polished surfaces are made to be reflective, for example, by coating them with a high reflectivity coating (e.g., a coating having a reflectivity of approximately 98% or more). The etalon has a resonant transmission due to interference from successive reflections between the reflective surfaces.

The resonant transmission of an etalon is well known in the field of optics and is therefore only briefly discussed here. The phase difference, $\delta$, between successive reflections between the reflective surfaces of the etalon is given by Equation 1:

$$\delta = \frac{4\pi n d \cos \theta_i}{\lambda} \quad (1)$$

Where n is the refractive index of the transmissive material, d is the distance between the reflective surfaces of the etalon, $\theta_i$ is the internal angle that the radiation inside the etalon makes with a surface normal to the reflective surfaces of the etalon and $\lambda$ is the wavelength of incident radiation. The internal angle $\theta_i$ is related to the angle of incidence $\theta_0$ of the radiation incident on the etalon by Snell's law:

$$n_0 \sin(\theta_0) = n_i \sin(\theta_i) \quad (2)$$

where $n_0$ is the refractive index of the medium surrounding the etalon and $n_i$ is the refractive index of the transmissive material of the etalon. Each etalon 251-255 may have a distance between the reflective surfaces of about 4 mm or more. Each etalon 251-255 may have a distance between the reflective surfaces of about 2 cm or less. For example, each etalon 251-255 may have a distance between the reflective surfaces of about 8 mm. Maximum transmission occurs when an optical path length difference between reflected rays of radiation is an integer multiple of wavelength. This condition is expressed mathematically by Equation 3:

$$2nd \cos \theta_i = m\lambda \quad (3)$$

where m is an integer.

The difference in wavelength, $\Delta\lambda$, between neighboring transmission peaks is known as the free spectral range of the etalon, and is given by Equation 4:

$$\Delta\lambda = \frac{\lambda_0^2}{2nd \cos \theta_i + \lambda_0} \quad (4)$$

Where $\lambda_0$ is the center wavelength of a given transmission peak. The etalon may be designed or selected such that the free spectral range of the etalon is matched to a desired resolution of the etalon. The free spectral range of the etalon 251-255 may be selected to substantially match or be slightly greater than a linewidth of the radiation that is to be measured using the etalon. For example, if the linewidth to be measured is about 0.3 pm then the free spectral range of the etalon 251-255 may be between about 0.5 pm and about 2 pm. As another example, if the linewidth to be measured is between about 0.7 pm and about 1.4 pm then the free spectral range of the etalon 251-255 may be between about 2 µm and about 4 pm. For example, the free spectral range of each etalon 251-255 may be about 1 pm. Finesse may be understood to be the ratio of the free spectral range of an etalon 251-255 and the minimum resolvable wavelength difference. The finesse of each etalon 251-255 may be 20 or more. The finesse of each etalon 251-255 may be 100 or less.

Each etalon 251-255 is illuminated at a range of different angles by the conditioned radiation beam 215 from the optical apparatus 205. For a given wavelength, only under certain angles (corresponding to the resonant transmission of the etalon 251-255) will the resonant condition (i.e., Equation 3) be satisfied. Therefore, if all rays of light having the same angle with respect to the object plane 245 are combined together (e.g., using a lens) the resultant aerial image (e.g., in a Fourier transform plane 246 to the object plane 245) will only be non-zero in parts of said plane 246 that correspond to said certain angles and an interference pattern 230 formed. The Fourier transform plane may be referred to as the pupil plane of the projection system. That is, illuminating the etalon 253 using a broad range of angles of incidence produces in the Fourier transform plane 246 a circular fringe pattern, the circles corresponding to the resonant conditions of the etalon 253. The exact position of each circular fringe depends on the wavelength of the radiation, the refractive index n of the transmissive material of the etalon as well as on the distance d between the reflective surfaces of the etalon, which are known. Thus, the angular distribution of radiation in the fringes will be indicative of the spectral distribution of the conditioned radiation beam 215. For example, the positions of the fringes may be dependent on a center wavelength $\lambda_0$ of the spectrum and a thickness of the fringes may be dependent on the width of the spectrum. An image of the circular fringes is formed on the radiation sensor 260 by the projection system 235. A spatial intensity distribution of the interference pattern 230 at the radiation sensor 260 may correspond to an angular distribution of the light in the interference pattern 230.

The fringes may be formed on a pupil plane of the projection system. The radiation sensor 260 may be located in or proximate a pupil plane of the projection system. The radiation sensor 260 may be offset from the pupil plane of the projection system, in which case the radiation sensor 260 may receive a distorted image of the fringes. The distorted image of the fringes may still be used to determine a spectral content of the conditioned radiation beam. For example, knowledge of the offset between the radiation sensor 260 and the pupil plane of the projection system may be used to account for distortion of the image of the fringes.

The spectrometer 220 is operable to determine spectral content of the conditioned radiation beam 215 at a plurality of positions at the object plane 245 of the projection system 235. In the example of FIG. 2, the radiation measurement system 200 further comprises an actuation system 265 configured to generate relative movement between the object plane 245 and the radiation sensor 260. In the example of FIG. 2, the actuation system 265 causes the radiation sensor 260 to move along the X-direction. Moving the radiation sensor 260 such that it receives transmitted light from etalons 251-255 at different positions in or proximate the object plane 245 provides a measurement of spectral content of the conditioned radiation beam 215 at different positions at the object plane 245. This information may be used, for example, to determine a spatial chirp of the conditioned radiation beam 215. Alternatively or additionally the radiation measurement system 200 may comprise a plurality of radiation sensors (see FIG. 3).

The radiation measurement system 200 further comprises a processor 270 configured to receive a signal indicative of the spatial intensity distribution of the interference pattern from the radiation sensor 260 and use the signal to determine a spectral intensity distribution of the conditioned radiation beam 215. The processor 270 may be configured to determine an angular intensity distribution of the interference pattern 230. The processor 270 may be configured to use an angular intensity of the interference pattern 230 and a spectral property of the interferometer 225 to determine the spectral intensity distribution of the conditioned radiation beam 215. The spectral property of the interferometer 225 may, for example, include a refractive index of the transmissive material of the etalon 251-255 and/or a distance between the two reflective surfaces of the etalon 251-255. For example, the processor 270 may determine a spectral intensity distribution of the conditioned radiation beam 215 at a single position in the object plane 245. Alternatively or additionally the processor 270 may be configured to determine a spatial distribution of the spectral intensity distribution of the conditioned radiation beam 215 across multiple positions of the object plane 245.

The processor 270 may be further configured to use the spectral intensity distribution of the conditioned radiation beam 215 to determine a bandwidth of the conditioned radiation beam 215. Alternatively, the processor 270 may determine a bandwidth of the conditioned radiation beam 215 (e.g., an E95 bandwidth of the conditioned radiation beam) directly by using a measured thickness and intensity of the detected circular fringes. The bandwidth may be an E95 bandwidth. The E95 bandwidth may correspond to the spectrum width in which 95% of the energy is present in the conditioned radiation beam 215. The processor 270 may be further configured to use the spectral intensity distribution of the conditioned radiation beam 215 to determine a center wavelength of the conditioned radiation beam 215. Alternatively, the processor 270 may determine a center wavelength of the conditioned radiation beam 215 directly by using a measured central position of the detected circular fringes. The center wavelength of the conditioned radiation beam 215 may be defined as being the wavelength of the conditioned radiation beam 215 that has the greatest associated value of intensity. Alternatively, the center wavelength of the conditioned radiation beam 215 may be defined as being the wavelength that is closest to a center of the spectral distribution of the conditioned radiation beam 215, for example, a center of gravity of the spectral distribution.

For example, the conditioned radiation beam 215 may have an E95 bandwidth of about 0.3 pm. The E95 bandwidth of the conditioned radiation beam 215 may vary by about 10 fm or more due to unwanted optical effects that may lead to a lithographic error. An etalon 251-255 may have a thickness of about 7.5 mm and a finesse of, for example, 50. Finesse may be understood to be the ratio of the free spectral range of the etalon 251-255 to the minimum resolvable wavelength difference achievable using the etalon 251-255. The etalon 251-255 would be able to fully resolve about 0.03 pm differences between spectral components of the conditioned radiation beam 215 and provide a measurement of the E95 bandwidth of the conditioned radiation beam 215. As will be described further below, such an etalon 251-255 could be mounted on a reticle MA or a support structure 241 of a lithographic apparatus LA (e.g., of the type shown in FIG. 1). By mounting several of these etalons 251-255 and calibrating and/or substantially matching their spectral transmission curves with reference to a reference optical system, the reticle comprising a plurality of etalons 251-255 could then be used, for example, to investigate the cause of lithographic errors in a lithographic apparatus LA that behaves in an errant manner. The calibration may involve measuring a spectrum of radiation using the reference optical system, determining spectral content of the radiation (e.g., the E95 bandwidth of the radiation) and repeating these two steps using the optical system that is to be calibrated. Differences in determined spectral content between the reference optical system and the optical system that is to be calibrated may be relevant for any differences in imaging performance between the optical systems. During the calibration, the imaging performance of the optical system that is to be calibrated may be controlled until the spectral content is substantially matched to the spectral content determined using the reference optical system.

The reticle MA, or supporting structure 241, comprising a plurality of etalons 251-255 could be used to determine whether or not the spectral content of the conditioned radiation beam 215 is contributing to the lithographic errors and, if so, how the lithographic errors could be reduced by controlling the lithographic apparatus LA.

When the radiation sensor 260 is part of a lithographic apparatus LA, the radiation sensor 260 may be located at the substrate support WT. The radiation sensor 260 may comprise an interferometric sensor, an aerial image sensor, etc. The radiation sensor 260 may be used for another purpose in addition to determining spectral content of the conditioned radiation beam 215. For example, the radiation sensor 260 may form part of an integrated lens interferometric sensor arranged in the lithographic apparatus LA. Such a sensor may be an interferometric wavefront measurement system that may perform optical measurements of optical aberrations up to a high order. U.S. Pat. No. 7,282,701B2, which is hereby incorporated by reference, discloses an example of an interferometric wavefront sensor that may be used, in conjunction with a spectrometer, to determine spectral content of the conditioned radiation beam 215.

Alternatively, the radiation sensor 260 may form part of a parallel lens interferometric sensor, which comprises a shearing interferometer that is configured to measure a wavefront (i.e., a locus of points with the same phase). The shearing interferometer may comprise a diffraction grating mark, for example a two dimensional grid, in or proximate an image plane of a lithographic apparatus and a photodetector arranged to detect an interference pattern. The interference pattern is related to the derivative of the phase of the radiation with respect to a coordinate in the pupil plane in the shearing direction. The photodetector may comprise an array of sensing elements such as, for example, charge coupled devices (CCDs). Determining aberrations, which are caused by the projection system PS of a lithographic apparatus LA, may comprise fitting the measurements which are made by the radiation sensor 260 to Zernike polynomials in order to obtain Zernike coefficients. Different Zernike coefficients may provide information about different forms of aberration, which are caused by the projection system PS. Stepping may be performed in the plane of the diffraction grating and in a direction perpendicular to the scanning direction of the measurement. This stepping of the diffraction grating effectively transforms phase variations into intensity variations, allowing phase information to be determined.

The processor 270 may be further configured to use the angular intensity distribution of the interference pattern 230 and the spectral property of the interferometer 225 to determine a spatial distribution of the bandwidth of the conditioned radiation beam 215. For example, the spatial distribution may be across the object plane 245 (e.g., the bandwidth at different X and Y coordinates of the object plane 245). The processor 270 may be further configured to use the angular intensity distribution of the interference pattern 230 and the spectral property of the interferometer 225 to determine a spatial distribution of the center wavelength of the conditioned radiation beam 215.

The processor 270 may be further configured to use the bandwidth of the conditioned radiation beam 215 to determine a contribution of the bandwidth of the conditioned radiation beam 215 to a speckle of the conditioned radiation beam 215. Speckle may occur due to interference between radiation which arrives at the point of observation (for example, during spectral measurements, the radiation sensor 260 or, during exposure, the substrate W) from different positions within a radiation beam and/or after traveling along different optical paths to the point of observation. For radiation to interfere, the phase of the electric field must be coherent. This is at least partially quantified by a temporal coherence length, which may be defined as a length in the direction of propagation of the radiation over which the radiation remains substantially coherent. This coherence length is inversely proportional to the bandwidth of the radiation. That is, the more monochromatic the radiation beam is, the longer the coherence length, and vice versa. Speckle at least partially depends on the coherence length of the radiation beam. Thus, speckle at least partially depends on the spectral bandwidth of the radiation beam. A measurement of the spectral bandwidth of the radiation beam thereby advantageously provides an indication of the contribution to the speckle of the radiation beam from the temporal coherence of the radiation beam.

The processor 270 may be further configured to use the spectral content of the conditioned radiation beam at a plurality of positions in the object plane 245 of the projection system 235 to determine a spatial chirp of the conditioned radiation beam 215. This may be achieved by, for example, comparing measurements taken from different parts of the object plane. A wavelength chirp may be measured as a shift (across the object plane) in the center positions of the fringes of the interference pattern on the radiation sensor. A change in E95 bandwidth of the radiation 210 may be measured as a change (across the object plane) in the shape and/or width of the fringes of the interference pattern on the radiation sensor 260.

Figure 3:
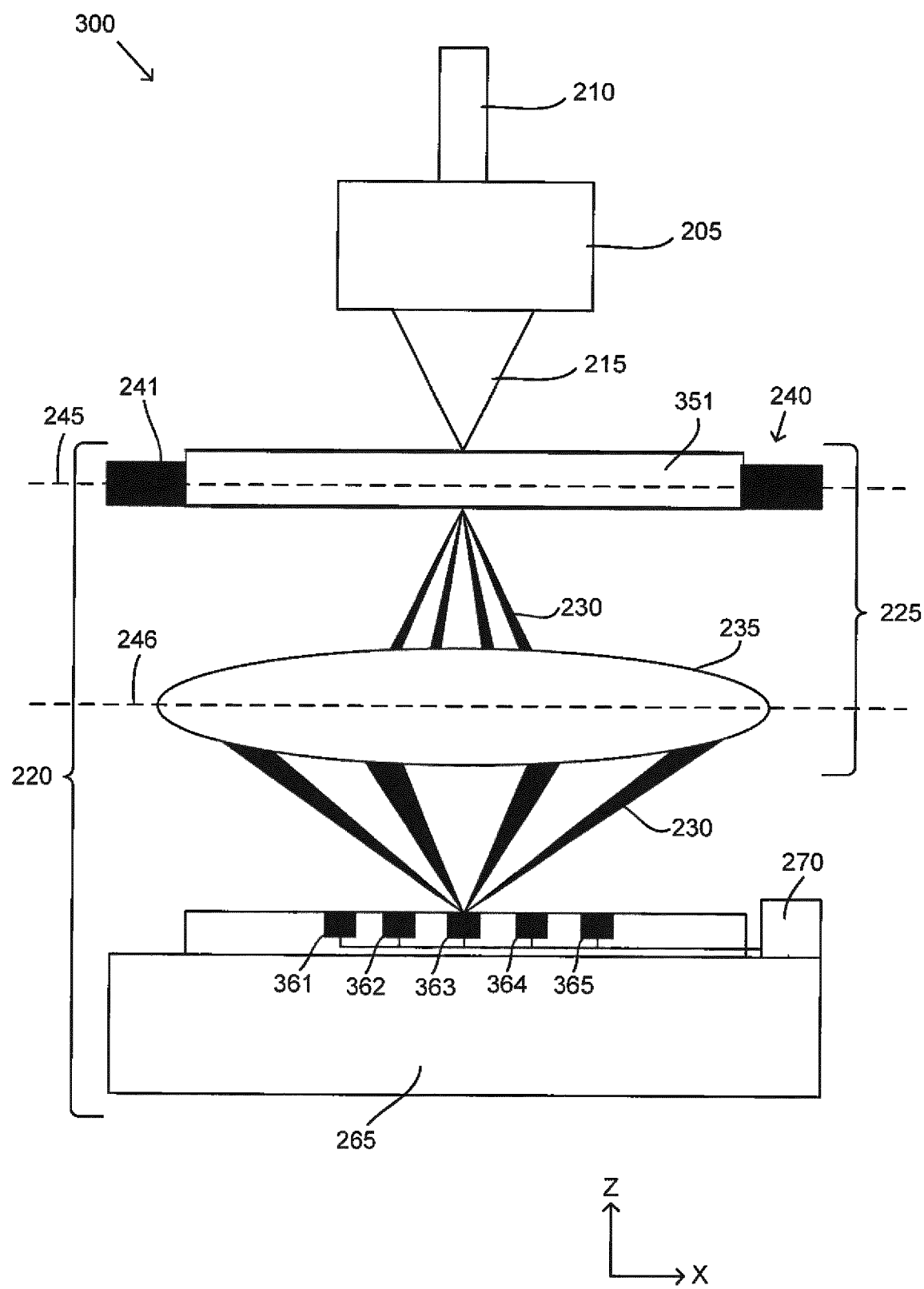
FIG. 3 schematically depicts a radiation measurement system having only one etalon according to an embodiment of the invention.

FIG. 3 schematically depicts an alternative radiation measurement system 300. Features of FIG. 3 and FIG. 2 that share common reference numerals are generally equivalent to one another and are therefore will not be described in detail below. The radiation measurement system 300 comprises an optical apparatus 205 configured to receive a radiation beam 210 and change an intensity distribution of the radiation beam 210 to output a conditioned radiation beam 215. The radiation measurement system 300 further comprises a spectrometer 220 operable to receive the conditioned radiation beam 215 and determine spectral content of the conditioned radiation beam 215. The spectrometer 220 comprises an interferometer 225 configured to cause the conditioned radiation beam 215 to interfere with itself and produce an interference pattern 230. One or more characteristics of the interference pattern 230 are indicative of the spectral content of the conditioned radiation beam 215. The spectrometer 220 further comprises a plurality of radiation sensors 361-365. Each radiation sensor 361-365 may comprise a plurality of pixels (not shown). The pixels may, for example, be arranged in an array. Each radiation sensor 361-365 may be an aerial image sensor comprising, for example, a CCD or CMOS camera. Each radiation sensor 361-365 may form part of an interferometric wavefront sensor, as discussed above.

The interferometer 225 comprises a projection system 235 (e.g., one or more lenses) and an interferometric element 240 positioned in or proximate to an object plane 245 of the projection system 235. The interferometric element 240 is held by a support 241. In the example of FIG. 3, the interferometric element 240 comprises a single etalon 351 that spans a desired portion of the object plane 245. The etalon 351 may be treated as a plurality of smaller etalons. That is, the etalon 351 may only have to conform to requirements (e.g. desired separation between reflective surfaces, desired flatness of reflective surfaces, an optical homogeneity of the transmissive material, etc.) over the individual areas that would act as smaller individual etalons. Compared to the embodiment of FIG. 2 (i.e., a plurality of separate etalons 251-255), this arrangement may advantageously simplify the process of mounting the etalon 351 to the support without unintentionally negatively affecting desired optical properties of the etalon 351. Using a single etalon 351 rather than a plurality of etalons 251-255 may advantageously sample spectral content of the conditioned radiation beam at substantially all locations in or proximate the object plane 245 rather than individual locations of the object plane 245.

The spectrometer 220 is operable to determine spectral content of the conditioned radiation beam 215 at a plurality of positions at the object plane 245 of the projection system 235. In the example of FIG. 3, the spectrometer 220 comprises a plurality of radiation sensors 361-365 arranged at different positions relative to the object plane 245 such that each radiation sensor 361-365 is configured to detect a spatial intensity distribution of the interference pattern 230 arising from a different position at the object plane 245. This information may be used, for example, to determine a spatial chirp of the conditioned radiation beam 215. Multiple radiation sensors 361-365 may be used simultaneously to provide parallel measurements of spectral content of the conditioned radiation beam 215.

In the example of FIG. 3, the radiation measurement system 300 further comprises an actuation system 265 configured to generate relative movement between the object plane 245 and the radiation sensors 361-365. In the example of FIG. 3, the actuation system 265 causes the radiation sensors 361-365 to move along the X-direction. The actuation system 265 may be used in combination with the large single etalon 351 and the plurality of radiation sensors 361-365 to determine spectral content of the conditioned radiation beam 215 at a plurality of positions at the object plane 245 of the projection system 235.

The radiation measurement system 300 further comprises a processor 270, which may be configured to operate in the same way described above in relation to the processor shown in FIG. 2 to determine spectral content of the conditioned radiation beam 215.

Referring again to FIG. 1, the lithographic apparatus LA comprises an illumination system IL configured to receive a radiation beam and change an intensity distribution of the radiation beam to output a conditioned radiation beam B. The illumination system IS may be considered to be an example of an optical apparatus 205 such as those shown in FIG. 2 and FIG. 3. The lithographic apparatus LA further comprises a support structure MT for supporting a reticle MA in or proximate to an object plane 145 of the projection system PS of the lithographic apparatus LA such that the reticle MA is arranged to receive the conditioned radiation beam B and impart the conditioned radiation beam B with a pattern in its cross-section. The substrate support MT and/or the reticle MA may be considered to be an example of a support 241 such as those shown in FIG. 2 and FIG. 3. The lithographic apparatus LA further comprises a substrate table WT for supporting a substrate W in or proximate to an image plane of the lithographic apparatus LA. The substrate support WT is connected to a second positioner PW configured to accurately position the substrate support WT with respect to the object plane of the lithographic apparatus LA. The substrate support WT and the second positioner PW may be considered to be an example of an actuation system 265 such as those shown in FIG. 2 and FIG. 3. The lithographic apparatus LA further comprises a projection system PS configured to project the pattern onto the substrate W. The projection system PS may be considered to be an example of a projection system 235 such as those shown in FIG. 2 and FIG. 3.

The lithographic apparatus LA further comprises a spectrometer operable to receive the conditioned radiation beam B and determine spectral content of the conditioned radiation beam B. The spectrometer, which forms part of the lithographic apparatus LA, may be considered to be an example of a spectrometer 220 such as those shown in FIG. 2 and FIG. 3. The spectrometer, which forms part of the lithographic apparatus LA, comprises an interferometer configured to cause the conditioned radiation beam B to interfere with itself and produce an interference pattern (not shown). One or more characteristics of the interference pattern are indicative of spectral content of the conditioned radiation beam B. The interferometer comprises an interferometric element 110 positioned in or proximate to an object plane of the projection system PS. In the example of FIG. 1, the interferometric element 110 comprises a plurality of etalons 151-154 arranged at different positions in or proximate to the object plane 145 of the projection system PS.

The spectrometer, which forms part of the lithographic apparatus LA, may be operable to determine spectral content of the conditioned radiation beam B at a plurality of positions in the object plane 145 of the projection system PS. The spectrometer, which forms part of the lithographic apparatus LA, comprises a radiation sensor 160 configured to detect a spatial intensity distribution of the interference pattern produced by the interferometer. As previously discussed, the lithographic apparatus LA further comprises the substrate support WT and the second positioner PW which may be considered to be an example of an actuation system 265 such as those shown in FIG. 2 and FIG. 3. The actuation system WT, PW is configured to generate relative movement between the object plane 145 of the projection system PS and the radiation sensor 160. The spectrometer, which forms part of the lithographic apparatus LA, may alternatively comprise a plurality of radiation sensors arranged at different positions relative to the object plane 145 of the projection system PS such that each radiation sensor is configured to detect a spatial intensity distribution of the interference pattern arising from a different position at the object plane 145.

The lithographic apparatus LA further comprises a processor 120 configured to receive a signal indicative of the spatial intensity distribution of the interference pattern from the radiation sensor 160 and use the signal to determine a spectral intensity distribution of the conditioned radiation beam B. The processor 120 may be configured to determine an angular intensity distribution of the interference pattern. The processor 120 may be configured to use the angular intensity distribution of the interference pattern and a spectral property of the interferometric element 110 to determine the spectral intensity distribution of the conditioned radiation beam. The spectral property of the interferometric element 110 may, for example, include a refractive index of the transmissive material of the etalon 151-154 and/or a distance between the two reflective surfaces of the etalon 151-154. The processor 120 may be further configured to use the spectral intensity distribution of the conditioned radiation beam B to determine a bandwidth of the conditioned radiation beam B. The processor 120 may be further configured to use the spectral intensity distribution of the conditioned radiation beam B to determine a center wavelength of the conditioned radiation beam B.

The processor 120 may be further configured to use the angular intensity distribution of the interference pattern and the spectral property of the interferometric element 110 to determine a spatial distribution of the bandwidth of the conditioned radiation beam B. The processor 120 may be further configured to use the angular intensity distribution of the interference pattern and the spectral property of the interferometric element 110 to determine a spatial distribution of the center wavelength of the conditioned radiation beam B.

The processor 120 may be further configured to use the bandwidth of the conditioned radiation beam B to determine a contribution of the bandwidth of the conditioned radiation beam B to a speckle of the conditioned radiation beam B.

In the example of FIG. 1, the interferometric element 110 (comprising etalons 151-154) may form part of the reticle MA. Alternatively or additionally, the etalons 151-154 may form part of the support structure MT. For example, the etalons 151-154 may be provided at a fiducial plate. The radiation sensor 160 is located at the substrate table WT. The lithographic apparatus LA may further comprise a controller 130 configured to receive a signal indicative of spectral content of the conditioned radiation beam B from the processor 120 and control a component of the lithographic apparatus LA in dependence on the spectral content determined by the spectrometer.

Figure 4:
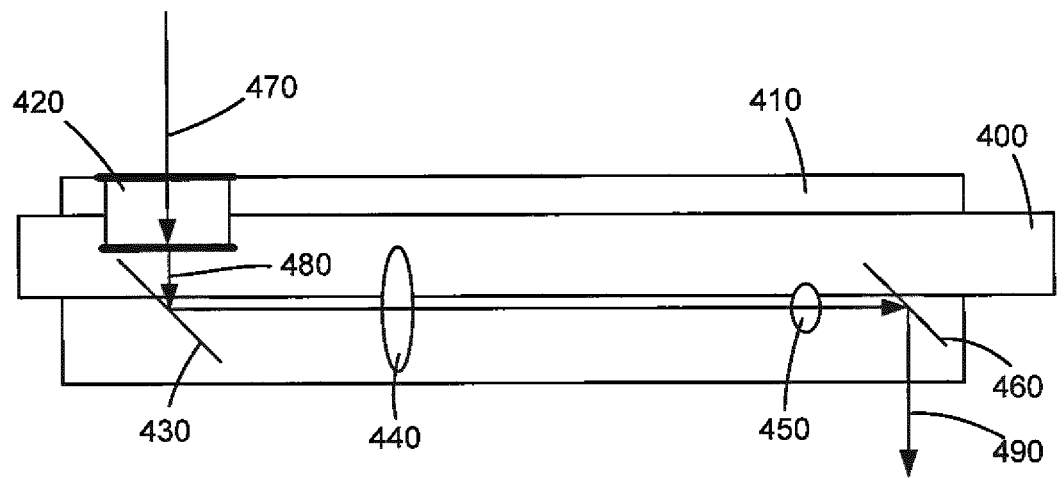
FIG. 4 schematically depicts a reticle comprising an etalon according to an embodiment of the invention.

FIG. 4 schematically depicts a reticle 400 comprising an etalon 420 and extension optics for increasing an angular extent of an interference pattern 480 generated by the etalon 420. In the example of FIG. 4, only one etalon 420 is shown in order to improve the clarity of FIG. 4. The reticle 400 may comprise a plurality of etalons, e.g., seven or more etalons. The reticle 400 is suitable for use in a lithographic apparatus such as the lithographic apparatus LA depicted in FIG. 1 and suitable for use in a radiation measurement system such as those depicted in FIG. 2 and FIG. 3. The reticle 400 comprises a housing 410. The housing 410 comprises the etalon 420, a first reflector 430, a first focusing element 440, a second focusing element 450 and a second reflector 460. A conditioned radiation beam 470 interacts with the etalon 420. The conditioned radiation beam 470 may, for example, have an angular extent of about 10 mrad. An angular extent of 10 mrad may, for example, correspond to about 0.04 times the numerical aperture of the lithographic apparatus LA. The etalon 420 causes the conditioned radiation beam 470 to interfere with itself and produce the interference pattern 480. The etalon 420 may, for example, be a cylinder with a diameter of about 9 mm and a thickness or length (i.e., a distance between reflective surfaces) of about 6 mm. The etalon 420 may, for example, have a finesse of about 50. The interference pattern 480 is incident upon the first reflector 430. The first reflector 430 reflects the interference pattern 480 towards the first focusing element 440. The first focusing element 440 may be a lens. The first focusing element 440 may, for example, have a focal length of about 120 mm. The first focusing element 440 focusses and directs the interference pattern to the second focusing element 450. The second focusing element 450 may be a lens. The second focusing element 450 may, for example, have a focal length of about −4 mm. The second focusing element 450 focusses and directs the interference pattern 480 towards the second reflector 460. The second reflector 460 directs the interference pattern 480 towards a radiation sensor (not shown) of the spectrometer (not shown).

The reticle 400 shown in FIG. 4 may be arranged differently. For example, the position of the etalon 420 and the position of the first reflector 430 could be switched and the etalon 420 could be rotated by 90°. In this example arrangement, the conditioned radiation beam 470 would reflect off the first reflector 430 before being incident upon the etalon 420. The etalon 420 would then cause the conditioned radiation beam 470 to interfere with itself and produce the interference pattern 480. The interference pattern 480 would then be incident upon the first focusing element 440. The first focusing element 440 would then focus and direct the interference pattern to the second focusing element 450. The second focusing element 450 would then focus and direct the interference pattern 480 towards the second reflector 460. The second reflector 460 would then direct the interference pattern 480 towards a radiation sensor (not shown) of the spectrometer (not shown).

The radiation beam exiting the housing 410 may be referred to as an extended radiation beam 490, because its angular extent has been extended by the focusing elements 440, 450. As previously discussed, a spectrometer comprising the reticle 400 (which may be generally of the form of the spectrometer 220 shown in FIGS. 1, 2 and 3) may then use the interference pattern to determine spectral content of the conditioned radiation beam 470. In this example, the extension optics (i.e., the first and second focusing elements 440, 450) act to increase the angular extent of the incoming conditioned radiation beam 470 by a factor of about thirty. That is, the conditioned radiation beam 470 has an angular extent of about 10 mrad and the extended radiation beam 490 has an angular extent of about 0.3 rad. An angular extent of about 0.3 rad may, for example, correspond to about 1.2 times the numerical aperture of an optical system, which receives the extended radiation beam 490, for example, a lithographic apparatus LA. Increasing the angular extent of the radiation beam advantageously spreads each fringe over many more pixels (e.g., thirty times as many pixels) of the radiation sensor to be used, thereby increasing a resolution of the spectral measurement. If the reticle 400 comprised a plurality of etalons then each etalon may have its own associated extension optics.

Alternatively, the housing 410, the etalon 420, the first reflector 430, the first focusing element 440, the second focusing element 450, and the second reflector 460 may be incorporated into a support structure for use in a lithographic apparatus, such as the support structure MT shown in the lithographic apparatus LA of FIG. 1. For example, the housing 410, the etalon 420, the first reflector 430, the first focusing element 440, the second focusing element 450, and the second reflector 460 may be incorporated into a fiducial plate. If the support structure comprises a plurality of etalons then each etalon may have its own associated extension optics.

The skilled person will appreciate that in order to achieve the same effect as may be obtained by the first reflector 430 and the first focusing element 440, a first reflective focusing element (for example, a non-flat mirror) may be used. The same accounts for the second focusing element 450 and the second reflector 460, which may be replaced by a second reflective element. Hence, the extension optics may herewith be formed by the first and second reflective focusing elements.

Alternatively, the extension optics may be formed partially by transmissive and reflective optical elements.

Figure 5:
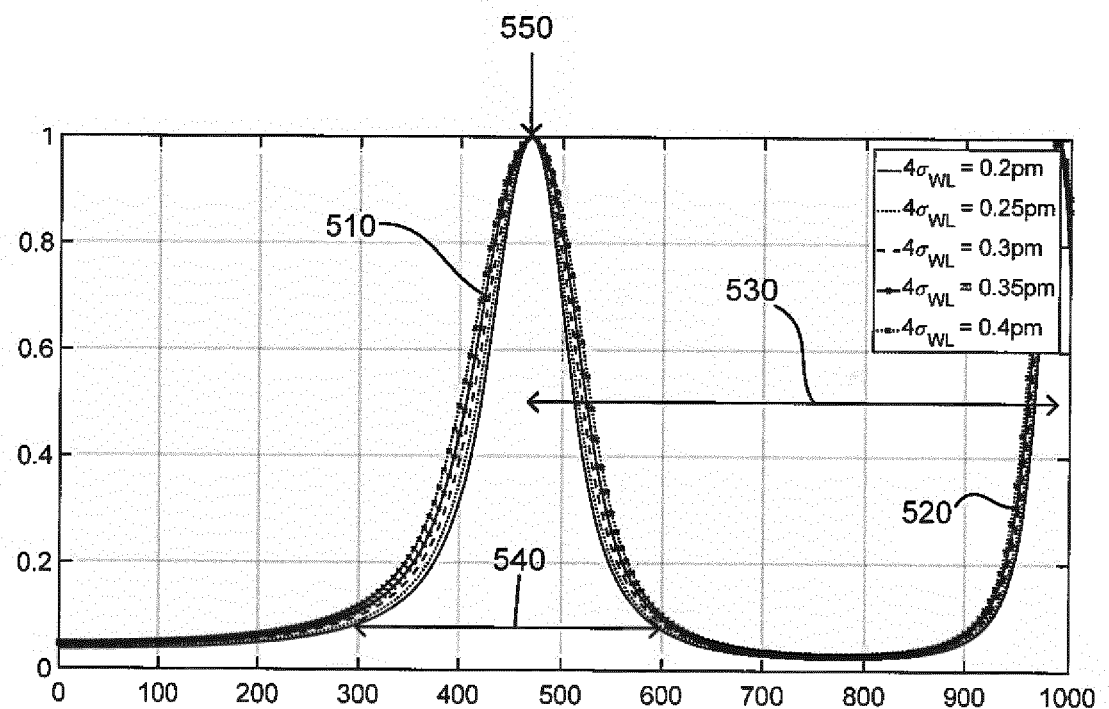
FIG. 5 is a graph showing the results of a simulation of an etalon being used to determine spectral content of a conditioned radiation beam in a lithographic apparatus according to an embodiment of the invention.

FIG. 5 is a graph showing the results of a simulation of an etalon being used to determine spectral content of a conditioned radiation beam in a lithographic apparatus. First and second fringes 510, 520 generated by the etalon and detected by a radiation sensor are shown in FIG. 5. A distance between the fringes 530 corresponds to the free spectral range of the etalon. A central position 550 of the first fringe 510 may correspond to a center wavelength of the radiation beam. In the simulation, the radiation beam has a center wavelength of about 193 nm and the etalon has a finesse of about 50. The y-axis corresponds to an intensity detected by the radiation sensor. The x-axis corresponds to a radial position on the radiation sensor 260 with "0" corresponding to the center of the pupil plane and "1000" corresponding to the edge of the pupil plane (i.e., corresponding to the numerical aperture of the lithographic apparatus LA). The x-axis may correspond to a radial coordinate of the pupil plane. A photosensitive region of the radiation sensor (e.g., an area of pixels) may correspond to the extent of the numerical aperture of the lithographic apparatus. Each of the five plots (having different colors) represents a different input E95 bandwidth. E95 representing the spectral width in which 95% of the spectral energy in radiation beam is present, this being ±2σ, where σ is the standard deviation of the distribution. As can be seen in FIG. 5, a width 540 of the first fringe 510 is dependent on the input E95 bandwidth. A resolution of the radiation sensor 260 may be selected such that one of the fringes (for example the first fringe 510) is spread over a sufficient number of pixels such that the E95 bandwidth can be determined to a desired accuracy. In other words, if it is desired to determine the E95 bandwidth to an accuracy of 0.05 pm, the resolution of the radiation sensor 260 may be selected such that one of the fringes (for example the first fringe 510) is spread over a sufficient number of pixels such that the five plots can be distinguished (the five plots representing different E95 bandwidths having a spacing of 0.05 pm). An angular extent of the radiation beam has been increased (by a factor of 30) using extension optics (e.g., those shown in FIG. 4) to spread each fringe 510, 520 over more pixels of the radiation sensor to increase a resolution of the spectral measurement. It will be appreciated that, alternatively, a radiation sensor 260 with a greater spatial resolution may be used. An advantage of using the extension optics is that better E95 bandwidth can be obtained using a camera with a given spatial resolution. This may allow an existing radiation sensor that may also be used for another purpose, for example, aberration measurements, to be used for the E95 bandwidth measurement whilst still achieving a desired accuracy.

Depending on the center wavelength of the radiation it may be possible that the fringes of the interference pattern (e.g., the centers of the fringes) are not located at desirable positions on the radiation sensor. For example, this situation may occur if the free spectral range of the etalon is so small that instead of a full fringe only part of one or two fringes is visible on the radiation sensor. A solution to this includes changing the center wavelength of the radiation to shift the position of the fringes on the radiation sensor. For example, the center wavelength may be changed by approximately half the free spectral range of the etalon. This change in center wavelength may shift the fringes on the radiation sensor such that at least one full fringe is incident on the radiation sensor. Accordingly, in some embodiments, the spectrometer may further comprise wavelength-shifting optics arranged to change the center wavelength of the radiation so as to shift the position of the fringes on the radiation sensor. Such wavelength-shifting optics may be provided upstream of the interferometer (for example the etalon), i.e., the radiation may interact with (for example propagate through) the wavelength-shifting optics before it propagates into the interferometer.

Figure 6:
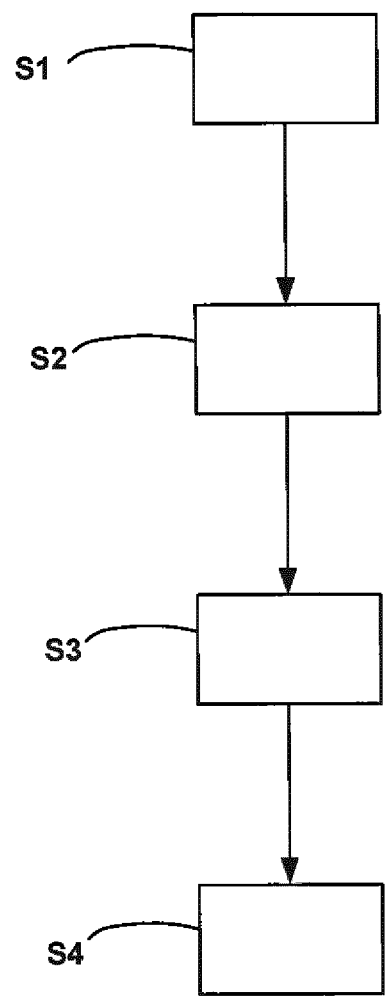
FIG. 6 is a flowchart of a method of determining a spectral intensity distribution of a conditioned radiation beam according to an embodiment of the invention; and, FIG. 7 is a flowchart of a method of performing a lithographic exposure using a lithographic apparatus according to an embodiment of the invention.

FIG. 6 shows a flowchart of a method of determining spectral content of a radiation beam after the optical apparatus has changed an intensity distribution of the radiation beam. The method comprises a first step S1 of using an interferometer to cause the radiation beam to interfere with itself and produce an interference pattern. One or more characteristics of the interference pattern are indicative of the spectral content of the radiation beam. The method comprises a second step S2 of detecting a spatial intensity distribution of the interference pattern. The method comprises a third step S3 of using the spatial intensity distribution of the interference pattern to determine an angular intensity distribution of the interference pattern. The method comprises a fourth step S4 of using the angular intensity distribution of the interference pattern and a spectral property of the interferometer to determine a spectral intensity distribution of the conditioned radiation beam. The third step S3 and the fourth step S4 may be combined.

The method may further comprise using the spectral intensity distribution of the conditioned radiation beam to determine a bandwidth of the conditioned radiation beam and/or a center wavelength of the conditioned radiation beam and/or spatial distributions thereof.

Figure 7:
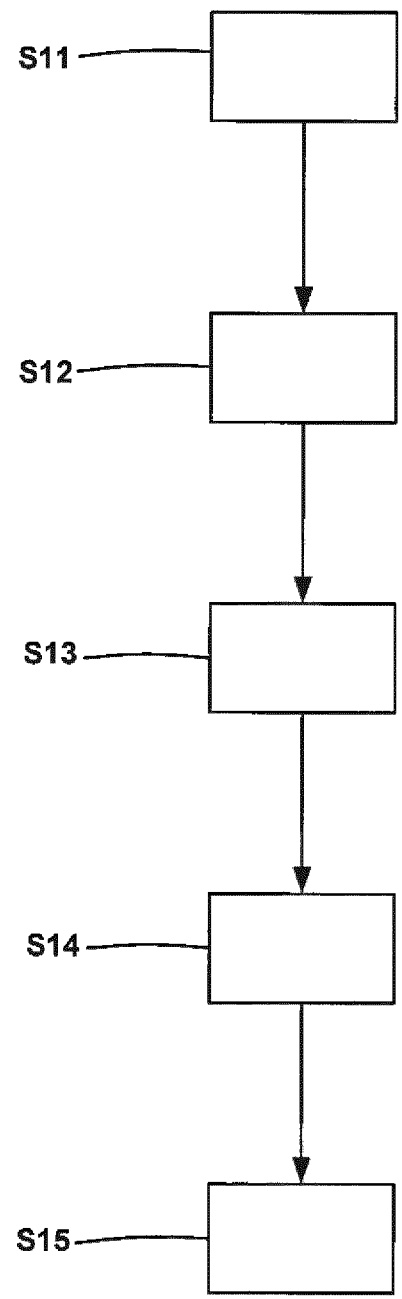

FIG. 7 shows a flowchart of a method of performing a lithographic exposure using a lithographic apparatus. The method comprises a first step S11 of receiving a radiation beam. The method comprises a second step S12 of changing an intensity distribution of the radiation beam to form a conditioned radiation beam. The method comprises a third step S13 of using a reticle held by a support structure in or proximate to an object plane of a projection system of the lithographic apparatus to impart the conditioned radiation beam with a pattern in its cross-section. The method comprises a fourth step S14 of projecting the pattern onto a substrate. The method comprises a fifth step S15 of determining spectral content of the conditioned radiation beam. The spectral content may be determined at a plurality of positions in or proximate to the object plane of the projection system. The spectral content may comprise a spectral intensity distribution, a bandwidth (e.g., an E95 bandwidth) and/or a center wavelength of the conditioned radiation beam, and/or spatial distributions thereof. The method may further comprise controlling a component of the lithographic apparatus in dependence on the spectral content of the conditioned radiation beam.

The method of FIG. 7 may further comprise performing another lithographic exposure using a different lithographic apparatus. The spectral content may be used to control either or both of the lithographic apparatus and thereby reduce a difference in performance between the two lithographic apparatus. That is, the spectral content may be used to match different lithographic apparatus to one another for a dual exposure process. For example, an E95 bandwidth of the two lithographic apparatus may be measured and at least one of the lithographic apparatus may be controlled so as to reduce a difference between the measured values of E95 bandwidth of the two lithographic apparatus. Spectral content may be determined for each lithographic apparatus for every photosensitive layer of a substrate that is to undergo lithographic exposure in each lithographic apparatus. Alternatively, spectral content may be determined for each lithographic apparatus after and/or before maintenance of components of the lithographic apparatus, e.g., maintenance of a laser source that supplies the lithographic apparatus with radiation. The spectrometers, for example, the radiation sensors for measuring aerial images, of the different lithographic apparatus may be calibrated and matched.

In addition, a method may be used to match proximity bias curves of different lithographic apparatus. That is, to form patterns on a substrate with a certain CD, the pattern on the patterning device is not simply a magnification of the pattern to be formed. Instead, the pitch of the pattern needs to be taken into account, i.e., the proximity (or proximity bias) of other patterns to the pattern that is to be provided onto the substrate. Two (or more) lithographic apparatus, each with a different bandwidth (e.g., a different E95 bandwidth), will have different proximity bias curves. By measuring the spectral characteristics of the conditioned radiation beam B, for example, the E95 bandwidth, by means of a radiation measurement system as described above, the radiation source SO may be tuned to match the proximity bias curves between two (or more) lithographic apparatus. The method of matching two (or more) lithographic apparatus comprises a first step of measuring a first proximity bias curve of a first lithographic apparatus. The method comprises a second step of measuring first spectral content (or characteristics) of a conditioned radiation beam of the first lithographic apparatus, to determine a first E95 bandwidth. The method comprises a third step of measuring a second proximity bias curve of a second lithographic apparatus. The method comprises a fourth step of measuring second spectral characteristics of a conditioned radiation beam of the second lithographic apparatus, to determine a second E95 bandwidth. The method further comprises a fifth step of adjusting at least one of the first E95 bandwidth and the second E95 bandwidth, in order to match the first and the second proximity bias curves. Herewith, matching two (or more) lithographic apparatus based on their E95 bandwidth.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatuses. Embodiments of the invention may form part of a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators (such as the actuation system WT, PW of FIG. 1) or other devices to interact with the physical world.

Aspects of the invention are set out in the clauses below Clauses:

1. A radiation measurement system comprising:
   an optical apparatus configured to receive a radiation beam and change an intensity distribution of the radiation beam to output a conditioned radiation beam; and,
   a spectrometer operable to receive the conditioned radiation beam and determine spectral content of the conditioned radiation beam.

2. The radiation measurement system of clause 1, wherein the spectrometer comprises an interferometer configured to cause the conditioned radiation beam to interfere with itself and produce an interference pattern, one or more characteristics of the interference pattern being indicative of the spectral content.

3. The radiation measurement system of clause 2, wherein the interferometer comprises a projection system and an interferometric element positioned in or proximate to an object plane of the projection system.

4. The radiation measurement system of clause 3, wherein the interferometric element comprises an etalon.

5. The radiation measurement system of clause 3, wherein the interferometric element comprises a plurality of etalons arranged at different positions in or proximate to the object plane of the projection system.

6. The radiation measurement system of any of clauses 3 to 5, wherein the spectrometer is operable to determine spectral content of the conditioned radiation beam at a plurality of positions in the object plane of the projection system.

7. The radiation measurement system of any of clauses 2 to 6, wherein the spectrometer comprises a radiation sensor configured to detect a spatial intensity distribution of the interference pattern.

8. The radiation measurement system of clause 7, further comprising an actuation system configured to generate relative movement between the object plane and the radiation sensor.

9. The radiation measurement system of clause 7 or clause 8, wherein the spectrometer comprises a plurality of radiation sensors arranged at different positions relative to the object plane such that each radiation sensor is configured to detect a spatial intensity distribution of the interference pattern arising from a different position on the object plane.

10. The radiation measurement system of any of clauses 7 to 9, further comprising a processor configured to receive a signal indicative of the spatial intensity distribution of the interference pattern from the radiation sensor and use the signal and a spectral property of the interferometer to determine spectral content of the conditioned radiation beam.

11. The radiation measurement system of clause 10 wherein the processor is configured to determine a spectral intensity distribution of the conditioned radiation beam.

12. The radiation measurement system of clause 10 or clause 11, wherein the processor is configured to determine a bandwidth of the conditioned radiation beam.

13. The radiation measurement system of any one of clauses 10 to 12, wherein the processor is configured to determine a center wavelength of the conditioned radiation beam.

14. The radiation measurement system of any of clauses 10 to 13, wherein the processor is further configured to determine a spatial distribution of the bandwidth of the conditioned radiation beam.

15. The radiation measurement system of any of clauses 10 to 14, wherein the processor is further configured to determine a spatial distribution of the center wavelength of the conditioned radiation beam.

16. The radiation measurement system of any of clauses 11 to 15, wherein the processor is further configured to determine a contribution of the spectral content of the conditioned radiation beam to a speckle of the conditioned radiation beam.

17. The radiation measurement system of clause 6, further comprising a processor configured to use the spectral content at a plurality of positions in the object plane of the projection system to determine a spatial chirp of the conditioned radiation beam.

18. A lithographic apparatus comprising:
   an illumination system configured to receive a radiation beam and change an intensity distribution of the radiation beam to output a conditioned radiation beam;
   a support structure for supporting a reticle in or proximate to an object plane of the lithographic apparatus such that the reticle is arranged to receive the conditioned radiation beam and impart the conditioned radiation beam with a pattern in its cross-section;
   a substrate table for supporting a substrate;
   a projection system configured to project the pattern onto the substrate; and,
   a spectrometer operable to receive the conditioned radiation beam and determine spectral content of the conditioned radiation beam.

19. The lithographic apparatus of clause 18, wherein the spectrometer comprises an interferometer configured to cause the conditioned radiation beam to interfere with itself and produce an interference pattern, one or more characteristics of the interference pattern being indicative of the spectral content.

20. The lithographic apparatus of clause 19, wherein the interferometer comprises an interferometric element positioned in or proximate to an object plane of the projection system.

21. The lithographic apparatus of clause 20, wherein the interferometric element comprises an etalon.

22. The lithographic apparatus of clause 21, wherein the interferometric element comprises a plurality of etalons arranged at different positions in or proximate to the object plane of the projection system.

23. The lithographic apparatus of any of clauses 20 to 22, wherein the spectrometer is operable to determine spectral content of the conditioned radiation beam at a plurality of positions in the object plane of the projection system.

24. The lithographic apparatus of clause 23, wherein the spectrometer comprises a radiation sensor configured to detect a spatial intensity distribution of the interference pattern.

25. The lithographic apparatus of clause 24, further comprising an actuation system configured to generate relative movement between the object plane and the radiation sensor.

26. The lithographic apparatus of clause 24, wherein the spectrometer comprises a plurality of radiation sensors arranged at different positions relative to the object plane such that each radiation sensor is configured to detect a spatial intensity distribution of the interference pattern arising from a different position on the object plane.

27. The lithographic apparatus of any of clauses 24 to 26, further comprising a processor configured to receive a signal indicative of the spatial intensity distribution of the interference pattern from the radiation sensor and use the signal and a spectral property of the interferometer to determine spectral content of the conditioned radiation beam.

28. The lithographic apparatus of clause 27, wherein the processor is configured to determine a spectral intensity distribution of the conditioned radiation beam.

29. The lithographic apparatus of clause 27 or clause 28, wherein the processor is configured to determine a bandwidth of the conditioned radiation beam.

30. The lithographic apparatus of any one of clauses 27 to 29, wherein the processor is configured to determine a center wavelength of the conditioned radiation beam.

31. The lithographic apparatus of any of clauses 28 to 30, wherein the processor is further configured to determine a spatial distribution of the bandwidth of the conditioned radiation beam.

32. The lithographic apparatus of any of clauses 28 to 31, wherein the processor is further configured to determine a spatial distribution of the center wavelength of the conditioned radiation beam.

33. The lithographic apparatus of clause 29, wherein the processor is further configured to use the bandwidth of the conditioned radiation beam to determine a contribution of the bandwidth of the conditioned radiation beam to a speckle of the conditioned radiation beam.

34. The lithographic apparatus of clause 23, further comprising a processor configured to use the spectral content at a plurality of positions in the object plane of the projection system to determine a spatial chirp of the conditioned radiation beam.

35. The lithographic apparatus of any of clauses 20 to 34, wherein the interferometric element forms part of the reticle.

36. The lithographic apparatus of clause 35, wherein the reticle further comprises extension optics configured to increase an angular extent of the interference pattern.

37. The lithographic apparatus of any of clauses 20 to 34, wherein the interferometric element forms part of the support structure.

38. The lithographic apparatus of clause 37, wherein the support structure further comprises extension optics configured to increase an angular extent of an interference pattern.

39. The lithographic apparatus of any of clauses 24 to 38, wherein the radiation sensor is located at the substrate table.

40. The lithographic apparatus of any of clauses 18 to 39, further comprising a controller configured to control a component of the lithographic apparatus in dependence on the spectral content.

41. A reticle for use in a lithographic apparatus, the reticle comprising an etalon.

42. The reticle of clause 41, further comprising extension optics configured to increase an angular extent of an interference pattern generated by the etalon.

43. The reticle of clause 41, wherein the reticle comprises a plurality of etalons.

44. The reticle of clause 43, further comprising extension optics configured to increase an angular extent of an interference pattern generated by each etalon.

45. A support structure constructed to support a reticle in or proximate to an object plane of a lithographic apparatus, the support structure comprising an etalon.

46. The support structure of clause 45, further comprising extension optics configured to increase an angular extent of an interference pattern generated by the etalon.

47. The support structure of clause 45, wherein the support structure comprises a plurality of etalons.

48. The support structure of clause 47, further comprising extension optics configured to increase an angular extent of an interference pattern generated by each etalon.

49. A method of determining a spectral content of a radiation beam after an optical apparatus has changed an intensity distribution of the radiation beam comprising:
    using an interferometer to cause the radiation beam to interfere with itself and produce an interference pattern, wherein one or more characteristics of the interference pattern being indicative of the spectral content;
    detecting a spatial intensity distribution of the interference pattern;
    using the spatial intensity distribution of the interference pattern and a spectral property of the interferometer to determine spectral content of the radiation beam.

50. The method of clause 49, further comprising positioning an interferometric element of the interferometer in or proximate to an object plane of the optical apparatus.

51. The method of clause 49 or clause 50, wherein the interferometric element comprises an etalon and wherein using the interferometer comprises causing the radiation beam to interact with the etalon.

52. The method of clause 51, wherein the interferometric element comprises a plurality of etalons and wherein the method further comprises arranging the etalons at different positions in or proximate to the object plane of the optical apparatus.

53. The method of any of clauses 50 to 52, further comprising determining the spectral content at a plurality of positions at the object plane of the optical apparatus.

54. The method of any of clauses 49 to 53, further comprising detecting a spatial intensity distribution of the interference pattern arising from different positions in or proximate to the object plane.

55. The method of any of clauses 49 to 54, further comprising using the spectral intensity distribution of the conditioned radiation beam to determine a bandwidth of the conditioned radiation beam.

56. The method of any of clauses 49 to 55, further comprising using the spectral intensity distribution of the conditioned radiation beam to determine a center wavelength of the conditioned radiation beam.

57. The method of any of clauses 49 to 56, further comprising determining a spatial distribution of the bandwidth of the conditioned radiation beam.

58. The method of any of clauses 49 to 57, further comprising determining a spatial distribution of the center wavelength of the conditioned radiation beam.

59. The method of any of clauses 49 to 58, further comprising using the bandwidth of the conditioned radiation beam to determine a contribution of the spectral content of the conditioned radiation beam to a speckle of the conditioned radiation beam.

60. The method of any one of clauses 49 to 58, further comprising using the spectral content at a plurality of positions in the object plane of the optical apparatus to determine a spatial chirp of the conditioned radiation beam.

61. A method of performing a lithographic exposure using a lithographic apparatus comprising:
  receiving a radiation beam;
  changing an intensity distribution of the radiation beam to form a conditioned radiation beam; using a reticle held by a support structure in or proximate to an object plane of a projection system of the lithographic apparatus to impart the conditioned radiation beam with a pattern in its cross-section;
  projecting the pattern onto a substrate; and,
    controlling a component of the lithographic apparatus in dependence on a spectral content of the conditioned radiation beam as determined using the method of any one of clauses 49 to 60.

62. The method of clause 61 further comprising performing another lithographic exposure using a different lithographic apparatus, wherein the spectral content is used to reduce a difference in performance between the two lithographic apparatus.

63. A method of matching a first lithographic apparatus and a second lithographic apparatus comprising:
  measuring a first proximity bias curve of the first lithographic apparatus;
  measuring first spectral content of a conditioned radiation beam of the first lithographic apparatus to determine a first bandwidth;
  measuring a second proximity bias curve of the second lithographic apparatus;
  measuring second spectral content of a conditioned radiation beam of the second lithographic apparatus to determine a second bandwidth; and
  adjusting at least one of the first bandwidth and the second bandwidth to match the first and the second proximity bias curves.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A radiation measurement system comprising:
  an optical apparatus configured to receive a radiation beam and change an intensity distribution of the radiation beam to output a conditioned radiation beam;
  a spectrometer operable to receive the conditioned radiation beam and determine a spectral content of the conditioned radiation beam; and
  a processor configured to:
    determine a bandwidth of the conditioned radiation beam, and
    use the bandwidth of the conditioned radiation beam to determine a contribution of the spectral content of the conditioned radiation beam to a speckle of the conditioned radiation beam.

2. The radiation measurement system of claim 1, wherein the bandwidth of the conditioned radiation beam comprises an E95 bandwidth corresponding to 95% of the entire spectral energy present in the conditioned radiation beam.

3. The radiation measurement system of claim 1, wherein the processor is configured to use the bandwidth of the conditioned radiation beam to determine a contribution of the bandwidth of the conditioned radiation beam to the speckle of the conditioned radiation beam.

4. The radiation measurement system of claim 1, wherein:
  the spectrometer comprises an interferometer configured to cause the conditioned radiation beam to interfere with itself and produce an interference pattern, and
  one or more characteristics of the interference pattern being indicative of the spectral content.

5. The radiation measurement system of claim 4, wherein the interferometer comprises a projection system and an interferometric element positioned in or proximate to an object plane of the projection system.

6. The radiation measurement system of claim 5, wherein the interferometric element comprises at least one etalon.

7. The radiation measurement system of claim 5, wherein the spectrometer is operable to determine the spectral content of the conditioned radiation beam at a plurality of positions in the object plane of the projection system.

8. The radiation measurement system of claim 7, wherein the processor is configured to use the spectral content at the plurality of positions at the object plane of the projection system to determine a spatial chirp of the conditioned radiation beam.

9. The radiation measurement system of claim 4, wherein the spectrometer comprises at least one radiation sensor configured to detect a spatial intensity distribution of the interference pattern.

10. The radiation measurement system of claim 9,
  wherein the processor is configured to receive a signal indicative of the spatial intensity distribution of the interference pattern from the at least one radiation sensor and to use the signal and a spectral property of the interferometer to determine the spectral content of the conditioned radiation beam.

11. The radiation measurement system of claim 10, wherein the processor is configured to determine at least one of:
  a spectral intensity distribution of the conditioned radiation beam,
  a center wavelength of the conditioned radiation beam,
  a spatial distribution of the bandwidth of the conditioned radiation beam, and
  a spatial distribution of the center wavelength of the conditioned radiation beam.

12. A method comprising:
  conditioning a radiation beam to output a conditioned radiation beam;

using an interferometer to cause the conditioned radiation beam to interfere with itself and produce an interference pattern, wherein one or more characteristics of the interference pattern being indicative of a spectral content;

detecting a spatial intensity distribution of the interference pattern;

using the spatial intensity distribution of the interference pattern and a spectral property of the interferometer to determine the spectral content of the conditioned radiation beam;

using a spectral intensity distribution of the conditioned radiation beam to determine a bandwidth of the conditioned radiation beam; and using the bandwidth of the conditioned radiation beam to determine a contribution of the spectral content of the conditioned radiation beam to a speckle of the conditioned radiation beam.

13. The method of claim 12, further comprising positioning an interferometric element of the interferometer in or proximate to an object plane of an optical apparatus.

14. The method of claim 13, further comprising:

determining the spectral content at a plurality of positions at the object plane of the optical apparatus;

detecting the spatial intensity distribution of the interference pattern arising from different positions in or proximate to the object plane;

using the spectral intensity distribution of the conditioned radiation beam to determine a center wavelength of the conditioned radiation beam;

determining a spatial distribution of the bandwidth of the conditioned radiation beam; or determining a spatial distribution of the center wavelength of the conditioned radiation beam.

15. The method of claim 14, further comprising using the spectral content at the plurality of positions in the object plane of the optical apparatus to determine a spatial chirp of the conditioned radiation beam.

16. The method of claim 12, wherein the conditioning the radiation beam comprises changing an intensity distribution of the radiation beam.

17. The method of claim 12, wherein the bandwidth of the conditioned radiation beam comprises an E95 bandwidth corresponding to 95% of the entire spectral energy present in the conditioned radiation beam.

18. The method of claim 12, further comprising using the bandwidth of the conditioned radiation beam to determine a contribution of the bandwidth of the conditioned radiation beam to the speckle of the conditioned radiation beam.

* * * * *

UNITED STATES PATENT AND TRADEMARK OFFICE
CERTIFICATE OF CORRECTION

PATENT NO. : 11,774,867 B2
APPLICATION NO. : 17/433494
DATED : October 3, 2023
INVENTOR(S) : Godfried et al.

It is certified that error appears in the above-identified patent and that said Letters Patent is hereby corrected as shown below:

In the Specification

In Column 12, Line 22, delete "μm" and insert -- pm --

Signed and Sealed this
Twenty-fifth Day of June, 2024

Katherine Kelly Vidal
*Director of the United States Patent and Trademark Office*